(12) United States Patent
Sun et al.

(10) Patent No.: US 11,139,311 B2
(45) Date of Patent: Oct. 5, 2021

(54) SEMICONDUCTOR NON-VOLATILE MEMORY DEVICES

(71) Applicant: GLOBALFOUNDRIES Singapore Pte. Ltd., Singapore (SG)

(72) Inventors: Yongshun Sun, Singapore (SG); Eng Huat Toh, Singapore (SG); Shyue Seng Tan, Singapore (SG); Kiok Boone Elgin Quek, Singapore (SG)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 0 days.

(21) Appl. No.: 16/790,696

(22) Filed: Feb. 13, 2020

(65) Prior Publication Data
US 2021/0257377 A1 Aug. 19, 2021

(51) Int. Cl.
*H01L 27/11568* (2017.01)
*H01L 29/08* (2006.01)
*H01L 29/06* (2006.01)
*H01L 21/28* (2006.01)
*H01L 29/423* (2006.01)
*H01L 29/66* (2006.01)

(52) U.S. Cl.
CPC .... *H01L 27/11568* (2013.01); *H01L 29/0649* (2013.01); *H01L 29/0847* (2013.01); *H01L 29/40117* (2019.08); *H01L 29/42344* (2013.01); *H01L 29/66833* (2013.01)

(58) Field of Classification Search
CPC .......... H01L 29/4234-42352; H01L 29/40117; H01L 29/66833; H01L 27/11563-11568; H01L 29/0843-0886
See application file for complete search history.

(56) References Cited

U.S. PATENT DOCUMENTS

| | | | |
|---|---|---|---|
| 6,248,633 B1 * | 6/2001 | Ogura | G11C 11/5671 257/E21.679 |
| 9,257,554 B2 | 2/2016 | Shum et al. | |
| 10,079,316 B2 | 9/2018 | Shum et al. | |
| 2019/0165115 A1 * | 5/2019 | Lin | H01L 27/1157 |

FOREIGN PATENT DOCUMENTS

| | | |
|---|---|---|
| JP | 2014211095 A | 11/2014 |
| JP | 201594287 A | 5/2015 |
| JP | 2015111190 A | 6/2015 |

OTHER PUBLICATIONS

Krishnaswamy Ramkumar et al., Cypress SONOS Technology, Aug. 2019, 1-16, Cypress Semiconductor California, United States.
NeoFlash, 2019, 1-6, eMemory Technology Inc, Taiwan.
S. Tsuda et al., First Demonstration of FinFET Split-Gate MONOS for High-Speed and Highly-Reliable Embedded Flash in 16/14nm-node and beyond, 2016, 1-4, IEEE, New Jersey, United States.

* cited by examiner

*Primary Examiner* — Sonya McCall-Shepard
(74) *Attorney, Agent, or Firm* — David Cain (57) ABSTRACT

A memory device is provided, which includes a substrate, a first memory cell, and a second memory cell. The first memory cell is arranged over the substrate and the second memory cell is arranged adjacent to the first memory cell. The first and second memory cells include a shared doped region arranged between the first and second memory cells.

16 Claims, 7 Drawing Sheets

SEMICONDUCTOR NON-VOLATILE MEMORY DEVICES

FIELD OF THE INVENTION

The disclosed subject matter relates generally to semiconductor devices, and more particularly to semiconductor non-volatile memory devices and methods of forming the same.

BACKGROUND

Semiconductor memory devices can be generally split into volatile memory devices and non-volatile memory (NVM) devices. Volatile memory devices lose data when power is interrupted while NVM devices retain data even when the power supply is turned off. The NVM device typically includes a memory transistor device and a select transistor device that forms a two-transistor (2T) memory cell of the NVM device. The memory transistor device may be programmed or erased by storing or removing charges, while the select transistor device selects the memory transistor device to be programmed or erased.

However, with technological advances in the semiconductor industry requiring increased device density, the NVM device having 2T memory cell may occupy a lot of device area. Therefore, in order to keep up with the technological advances, NVM devices having a more compact size and methods of forming the same are provided to overcome, or at least ameliorate, the disadvantage described above.

SUMMARY

To achieve the foregoing and other aspects of the present disclosure, non-volatile memory (NVM) devices and methods of forming the same are presented.

According to an aspect of the present disclosure, a memory device is provided, which includes a substrate, a first memory cell, and a second memory cell. The first memory cell is arranged over the substrate and the second memory cell is arranged adjacent to the first memory cell. The first and second memory cells include a shared doped region arranged between the first and second memory cells.

According to another aspect of the present disclosure, a memory device is provided, which includes a substrate, a first memory cell, and a second memory cell. The first memory cell is arranged over the substrate and includes a shared source region in the substrate, a control gate, and a first gate. The second memory cell is arranged adjacent to the first memory cell and includes the shared source region in the substrate, the control gate and a second gate.

According to yet another aspect of the present disclosure, a memory device is provided, which includes a substrate, a first memory cell, and a second memory cell. The first memory cell includes a first control gate, a first select gate, and a shared source region in the substrate. The second memory cell includes a second control gate, a second select gate, and the shared source region, wherein the shared source region is arranged between the first and second memory cells.

BRIEF DESCRIPTION OF THE DRAWINGS

The embodiments of the present disclosure will be better understood from a reading of the following detailed description, taken in conjunction with the accompanying drawings.

For simplicity and clarity of illustration, the drawings illustrate the general manner of construction, and certain descriptions and details of well-known features and techniques may be omitted to avoid unnecessarily obscuring the discussion of the described embodiments of the device. Additionally, elements in the drawings are not necessarily drawn to scale. For example, the dimensions of some of the elements in the drawings may be exaggerated relative to other elements to help improve understanding of embodiments of the device. The same reference numerals in different drawings denote the same elements, while similar reference numerals may, but do not necessarily, denote similar elements.

DETAILED DESCRIPTION

The present disclosure relates to semiconductor non-volatile memory (NVM) devices and methods of forming the same. Various embodiments of the present disclosure are now described in detail with accompanying drawings. It is noted that like and corresponding elements are referred to by the use of the same reference numerals. The embodiments disclosed herein are exemplary, and not intended to be exhaustive or limiting to the disclosure.

Figure 1A:
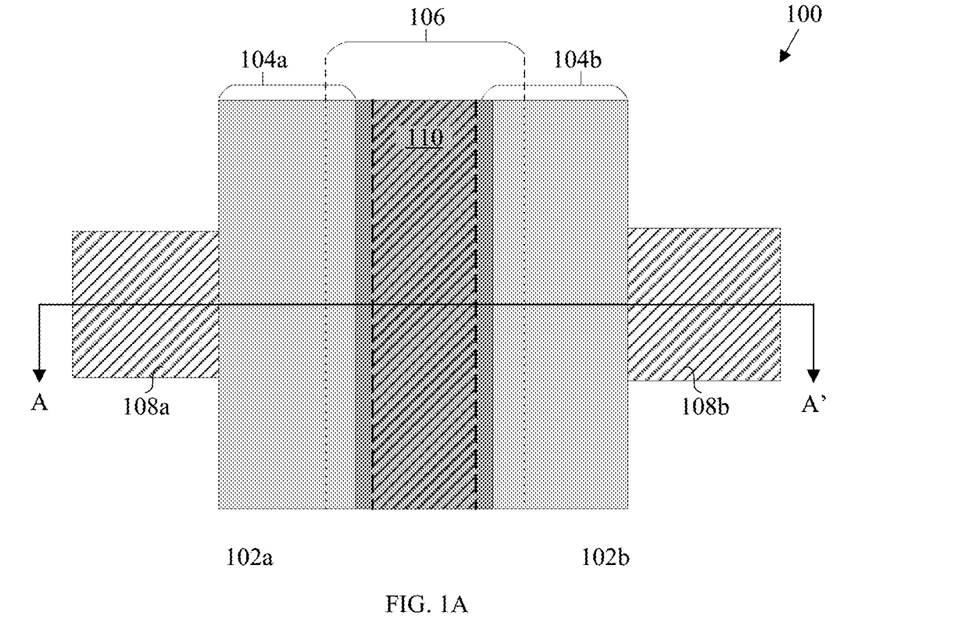
FIGS. 1A-1B are a simplified top view and a cross-sectional view of a non-volatile memory (NVM) device, respectively, according to an embodiment of the disclosure.
Figure 1B:
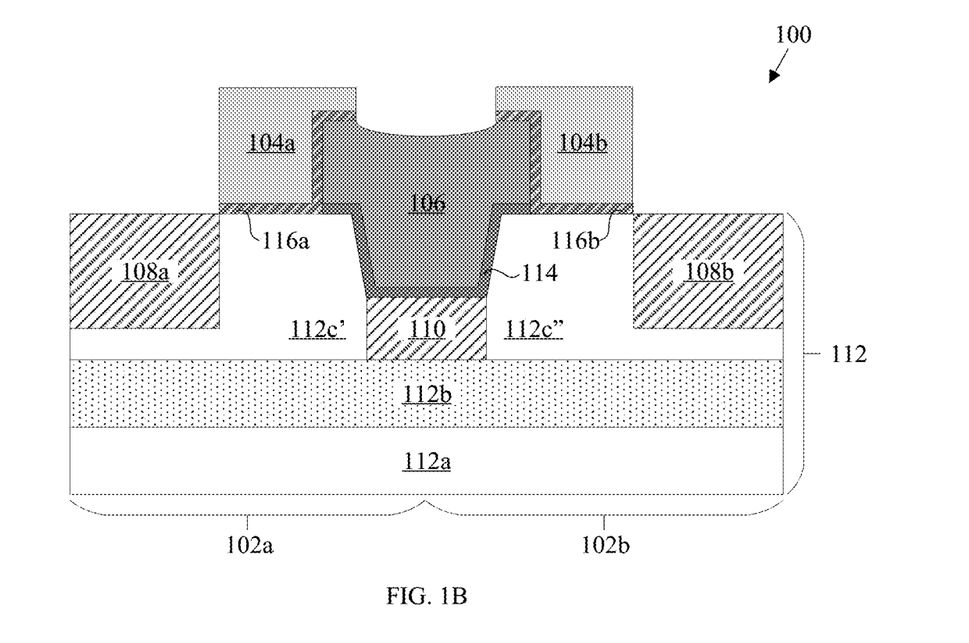

Referring to FIGS. 1A-1B, FIG. 1A is a simplified top view of a non-volatile memory (NVM) device 100 and FIG. 1B is a cross-sectional view of the NVM device 100 taken along a line A-A' in FIG. 1A, according to an embodiment of the disclosure. The NVM device 100 may be arranged in a memory cell region of a semiconductor device and the NVM device 100 may be part of a plurality of NVM devices arranged in an array configuration of rows and columns in the memory cell region. Only one NVM device is illustrated for clarity purposes. The NVM device 100 may include a first memory cell 102a and a second memory cell 102b.

The NVM device 100 may include a first gate 104a, a second gate 104b, and a third gate 106, a first doped region 108a, a second doped region 108b and a third doped region 110. The first gate 104a, the third gate 106, the first doped region 108a and the third doped region 110 form the first memory cell 102a. The second gate 104b, the third gate 106, the second doped region 108b and the third doped region 110 form the second memory cell 102b. The third gate 106 may be arranged between the first gate 104a and the second gate 104b and may be shared between the first memory cell 102a and the second memory cell 102b.

In an embodiment of the disclosure, the first gate 104a, the second gate 104b and the third gate 106 may be arranged in an arrangement configuration such that the first and second gates (104a and 104b, respectively) partially overlays laterally opposite sides of the third gate 106. Sides of the third gate 106 overlaid by the first and second gates (104a and 104b, respectively) are demarcated by a pair of dotted lines, as illustrated in FIG. 1A.

In an embodiment of the disclosure, the first gate 104a may serve as a first select gate for the first memory cell 102a and the second gate 104b may serve as a second select gate for the second memory cell 102b. The first gate 104a and a second gate 104b may be gate conductors for select transistor devices of memory cells, and each memory cell may have their dedicated select gate in an array of NVM devices. In an embodiment of the disclosure, the first gate 104a and the second gate 104b may include polysilicon gates or metal gates.

In an embodiment of the disclosure, the third gate 106 may be a gate shared between the first memory cell 102a and the second memory cell 102b and may serve as a common control gate for the first memory cell 102a and the second memory cell 102b. The control gate may be a gate conductor for a memory transistor device of a memory cell, and the control gate may serve as a common gate for a row of memory cells in an array of NVM devices. In an embodiment of the disclosure, the third gate 106 may include polysilicon gates or metal gates.

As illustrated in FIG. 1B, the NVM device 100 may be provided with a semiconductor substrate 112. The semiconductor substrate 112 may reside in the memory cell region of the semiconductor device and have regions defined to form the first memory cell 102a and the second memory cell 102b.

In an embodiment of the disclosure, the semiconductor substrate 112 may include a layered semiconductor substrate having a first semiconductor layer 112a, a second semiconductor layer 112c, and a buried dielectric layer 112b arranged between the first semiconductor layer 112a and the second semiconductor layer 112c. The first semiconductor layer 112a may include a semiconductor material such as, but not limited to, silicon, germanium, or combinations thereof. The second semiconductor layer 112c may include a semiconductor material such as, but not limited to, silicon, germanium, silicon-germanium, germanium-tin, graphene, indium gallium arsenide, cadmium sulfide, or combinations thereof. The buried dielectric layer 112b may include a dielectric material such as, but not limited to, silicon oxide, silicon nitride, aluminum oxide, or combinations thereof.

In an embodiment of the disclosure, the semiconductor substrate 112 may be a silicon-on-insulator substrate. In an embodiment of the disclosure, the semiconductor substrate 112 may include a bulk semiconductor material such as, but not limited to, silicon, germanium, silicon carbide, other II-VI or III-V semiconductor compounds, or combinations thereof.

In an embodiment of the disclosure, the first doped region 108a may be arranged adjacent to the first gate 104a in the first memory cell 102a, and the second doped region 108b may be arranged adjacent to the second gate 104b in the second memory cell 102b.

In an embodiment of the disclosure, the third doped region 110 may be arranged in a lower portion of the second semiconductor layer 112c such that it contacts the buried dielectric layer 112b. The third doped region 110 may divide the second semiconductor layer 112c into a first portion 112c' in the first memory cell 102a and a second portion 112c" in the second memory cell 102b. The first and second doped regions (108a and 108b, respectively) may be arranged in the first and second portions of the second semiconductor layer (112c' and 112c", respectively).

In an embodiment of the disclosure, the third doped region 110 may be further arranged between the first doped region 108a and the second doped region 108b. The third doped region 110 may be yet further arranged beneath the third gate 106 such that the third doped region 110 may be shared between the first and second memory cells (102a and 102b, respectively). An outer perimeter of the third doped region 110 is indicated by dashed lines, as illustrated in FIG. 1A.

In an embodiment of the disclosure, the first and second doped regions (108a and 108b respectively) may be an N-type conductivity region by doping the first and second portions of the second semiconductor layer (112c' and 112c", respectively) with N-type dopants such as, but not limited to, phosphorous, arsenic or antimony. In an embodiment of the disclosure, the first and second doped regions (108a and 108b respectively) may be a P-type conductivity region by doping the first and second portions of the second semiconductor layer (112c' and 112c", respectively) with P-type dopants such as, but not limited to, boron, indium or gallium.

In an embodiment of the disclosure, the third doped region 110 may have the same conductivity type as the first and second doped regions (108a and 108b, respectively). For example, if the first and second doped regions (108a and 108b, respectively) are N-type conductivity regions, the third doped region 110 is also an N-type conductivity region. In another example, if the first and second doped regions (108a and 108b, respectively) are P-type conductivity regions, the third doped region 110 is also a P-type conductivity region.

In an embodiment of the disclosure, the first doped region 108a and the second doped region 108b may be discrete doped regions. In an embodiment of the disclosure, the first doped region 108a may serve as a first drain region for the first memory cell 102a and the second doped region 108b may serve as a second drain region for the second memory cell 102b.

In an embodiment of the disclosure, the third doped region 110 may be a line feature that extends beyond the NVM device 100 and serves as a common doped region for a row of NVM devices in the array. In an embodiment of the disclosure, the third doped region 110 may serve as a common source region for the first and second memory cells (102a and 102b, respectively).

As illustrated in FIG. 1B, the first and second doped regions (108a and 108b, respectively) are not contacting the buried dielectric layer 112b, according to an embodiment of the disclosure. In another embodiment of the disclosure, the first and second doped regions (108a and 108b, respectively) are contacting the buried dielectric layer 112b.

In an embodiment of the disclosure, an insulating layer 114 may be arranged over the third doped region 110 as illustrated in FIG. 1B. The insulating layer 114 may be shared between the first memory cell 102a and the second memory cell 102b. The insulating layer 114 may be arranged between the third gate 106 and the third doped region 110 and between the third gate 106 and the first and second portions of the second semiconductor layer (112c' and 112c", respectively). The insulating layer 114 may serve to isolate the third gate 106 from the third doped region 110 and from the first and second portions of the second semiconductor layer (112c' and 112c", respectively).

In an embodiment of the disclosure, the insulating layer 114 may include a charge-trapping material that may be capable of or facilitate trapping of charges. The charge-trapping property of the insulating layer 114 enables NVM devices to retain data even when the power supply is disrupted or turned off.

In an embodiment of the disclosure, the insulating layer 114 may be a multilayered dielectric stack such as, but not limited to, an oxide-nitride-oxide (ONO) trilayer dielectric stack, an oxide/nitride bilayer dielectric stack, a nitride/oxide bilayer dielectric stack, an oxide/tantalum oxide bilayer dielectric stack, an oxide/tantalum oxide/oxide trilayer dielectric stack, an oxide/strontium titanate bilayer dielectric stack, an oxide/barium strontium titanate bilayer dielectric stack, an oxide/strontium titanate/oxide trilayer dielectric stack, an oxide/strontium titanate/barium strontium titanate trilayer dielectric stack, an oxide/hafnium oxide/oxide trilayer dielectric stack, an oxide trilayer dielectric stack, or the like (in each case, the first layer mentioned is the bottom layer while the last layer mentioned is the top layer).

In an embodiment of the disclosure, the insulating layer 114 may include a dielectric material having a dielectric constant greater than 3.9 such as, but not limited to, hafnium oxide, hafnium silicate, zirconium silicate, zirconium oxide, or combinations thereof.

In an embodiment of the disclosure, a first dielectric layer 116a and a second dielectric layer 116b may be arranged adjacent to the third gate 106, as further illustrated in FIG. 1B. The first dielectric layer 116a may be arranged between the first gate 104a and the first portion of the second semiconductor layer 112c', and between the first gate 104a and the third gate 106 in the first memory cell 102a, and the second dielectric layer 116b may be arranged between the second gate 104b and the second portion of the second semiconductor layer 112c'', and between the second gate 104b and the third gate 106 in the second memory cell 102b. The first and second dielectric layers (116a and 116b, respectively) and the first and second gates (104a and 104b, respectively) may partially overlay laterally opposite sides of the third gate 106.

In an embodiment of the disclosure, the first dielectric layer 116a may serve to isolate the first gate 104a from the third gate 106 and from the first portion of the second semiconductor layer 112c'. The second dielectric layer 116b may serve to isolate the second 104b from the third gate 106 and from the second portion of the second semiconductor layer 112c''.

In an embodiment of the disclosure, the first and second dielectric layers (116a and 116b, respectively) may serve as gate dielectric layers for the first and second gates (104a and 104b, respectively). The first and second dielectric layers (116a and 116b, respectively) may include, but not limited to, silicon dioxide.

In an embodiment of the disclosure, the first memory cell 102a may include a first memory transistor device and a first select transistor device. The first memory transistor device may include the third gate 106 with the first and third doped regions (108a and 110, respectively), and the first select transistor device may include the first gate 104a with the first and third doped regions (108a and 110, respectively). The second memory cell 102b may include a second memory transistor device and a second select transistor device. The second memory transistor device may include the third gate 106 with the second and third doped regions (108b and 110, respectively), and the second select transistor device may include the second gate 104b with the second and third doped regions (108b and 110, respectively).

Although FIGS. 1A-1B illustrate an embodiment of the NVM device 100, it is understood that the NVM device 100 may be configured in other arrangements, according to other embodiments of the disclosure. Additionally, the plurality of gates 104a, 104b and 106 may be provided with contact structures to interconnect the NVM device 100 to other semiconductor devices, such as logic devices, although the contact structures are not illustrated in the accompanying drawings.

Advantageously, by having the disclosed arrangement configurations in FIGS. 1A-1B, the NVM device 100 may include two memory cells, i.e., the first memory cell 102a and the second memory cell 102b, and the two memory cells share a common control gate, i.e., the third gate 106, and a common source region, i.e., the third doped region 110. The NVM device 100 may achieve a higher device density that takes up a smaller device area than an NVM device having a 2T or 1.5T memory device configuration.

FIGS. 2A-2D are cross-sectional views of the NVM device 100 (taken along the line A-A' in FIG. 1A), illustrating a method of forming the NVM device 100, according to an embodiment of the disclosure. Certain structures may be conventionally fabricated, for example, using known processes and techniques, and specifically disclosed processes and methods may be used to achieve individual aspects of the present disclosure.

Figure 2A:
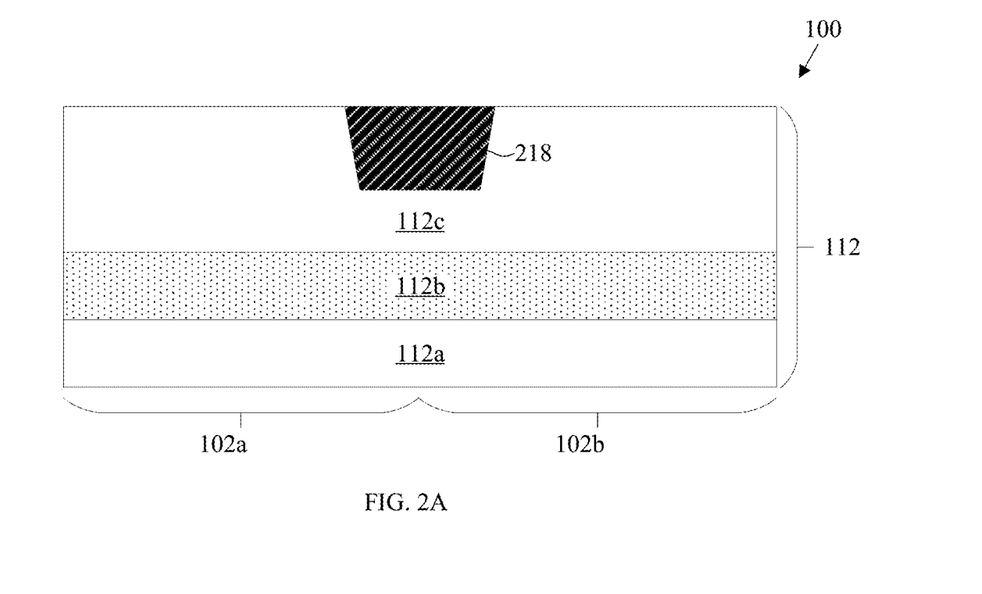
FIGS. 2A-2D are cross-sectional views of a non-volatile memory (NVM) device (taken along a line A-A' in FIG. 1A), illustrating various stages of forming the NVM device, according to embodiments of the disclosure.

An isolation structure 218 may be formed in the second semiconductor layer 112c of the layered semiconductor substrate 112 as illustrated in FIG. 2A, according to an embodiment of the disclosure. The isolation structure 218 may be formed in the second semiconductor layer 112c such that the isolation structure 218 may have a top surface substantially coplanar with a top surface of the second semiconductor layer 112c. The isolation structure 218 may be formed in an upper portion of the second semiconductor layer 112c such that the isolation structure 218 may be separated from the buried dielectric layer 112b by a lower portion of the second semiconductor layer 112c. In an embodiment of the disclosure, the isolation structure 218 may be formed between the first memory cell 102a and the second memory cell 102b of the NVM device 100.

In an embodiment of the disclosure, the isolation structure 218 may be formed by an exemplary process described herein. A trench (not shown) may be formed in the second semiconductor layer 112c using a material removal process, for example, a dry etching process. The isolation structure 218 may be formed by filling the trench (not shown) with a dielectric material to a level substantially coplanar with the top surface of the second semiconductor layer 112c using a deposition process, for example, a chemical vapor deposition (CVD) process or a high-density plasma CVD (HDPCVD) process. In an embodiment of the disclosure, the dielectric material may include, but not limited to, silicon dioxide or silicon nitride.

Figure 2B:
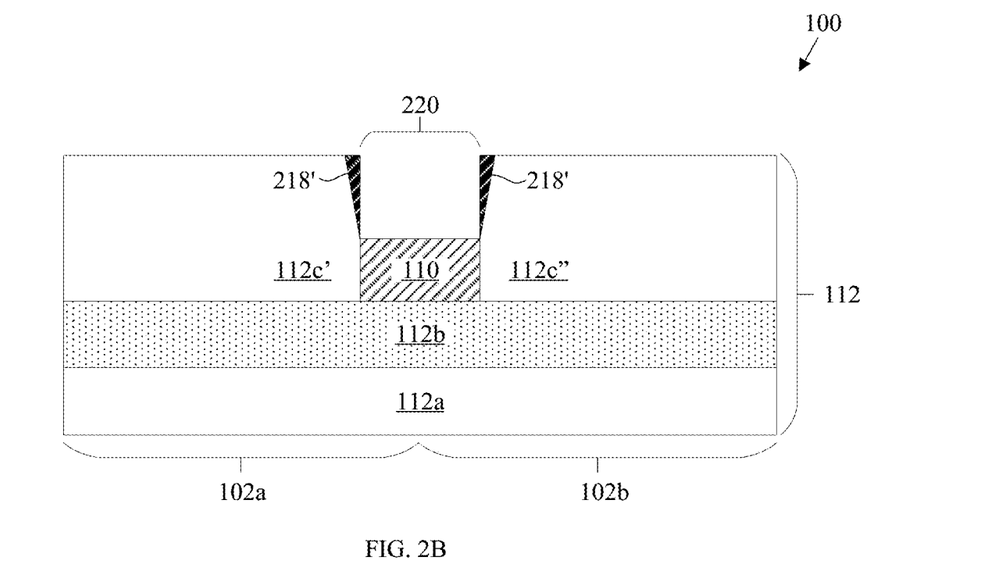

An opening 220 may be formed in the isolation structure 218 and the third doped region 110 may be formed in the lower portion of the second semiconductor layer 112c through the opening 220 as illustrated in FIG. 2B, according to an embodiment of the disclosure. Portions of the isolation structure 218' may remain on sidewalls of the second semiconductor layer 112c in the opening 220 after forming the opening 220. The third doped region 110 may divide the second semiconductor layer 112c into the first portion 112c' in the first memory cell 102a and the second portion 112c'' in the second memory cell 102b and may have a width substantially as wide as a width of the opening 220. The third doped region 110 may be formed such that it contacts the buried dielectric layer 112b.

In an embodiment of the disclosure, the third doped region 110 may be formed by an exemplary process described herein. The opening 220 may be formed in the isolation structure 218 using a material removal process, for example, a dry etching process. The third doped region 110 may be formed by introducing dopants using a doping process, for example, an implantation process through the opening 220. The third doped region 110 may extend towards and contact the buried dielectric layer 112b to divide the second semiconductor layer 112c into the first portion 112c' and the second portion 112c".

Figure 2C:
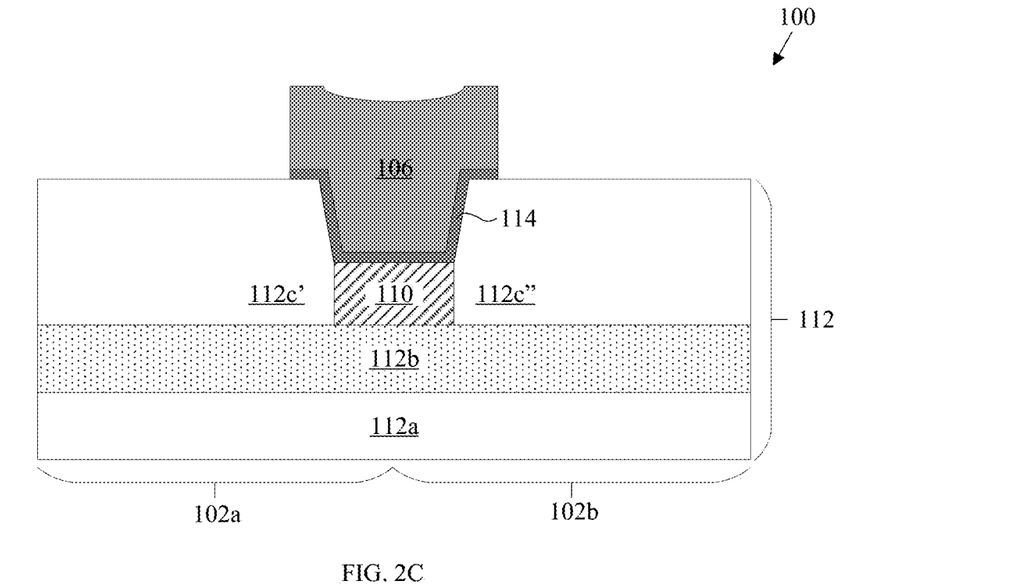

The insulating layer 114 and the third gate 106 may be formed over the third doped region 110 as illustrated in FIG. 2C, according to an embodiment of the disclosure. The remaining portions of the isolation structure 218' in FIG. 2B may be removed prior to forming the insulating layer 114.

In an embodiment of the disclosure, the insulating layer 114 and the third gate 106 may be formed by an exemplary process described herein. An isolation material (not shown) may be deposited over the first and second portions of the second semiconductor layer (112c' and 112c", respectively) and over the third doped region 110 in the trench vacated by the isolation structure (not shown) using a deposition process, for example, a CVD process or an atomic layer deposition (ALD) process. A gate material (not shown) may be deposited over the isolation material using a deposition process, for example, a CVD process or a physical vapor deposition (PVD) process. The insulating layer 114 and the third gate 106 may be formed by removing portions of the isolation material (not shown) and portions of the gate material (not shown) using a material removal process, for example, a dry etching process. The insulating layer 114 and the third gate 106 may extend over the top surfaces of the first and second portions of the second semiconductor layer (112c' and 112c", respectively).

Figure 2D:
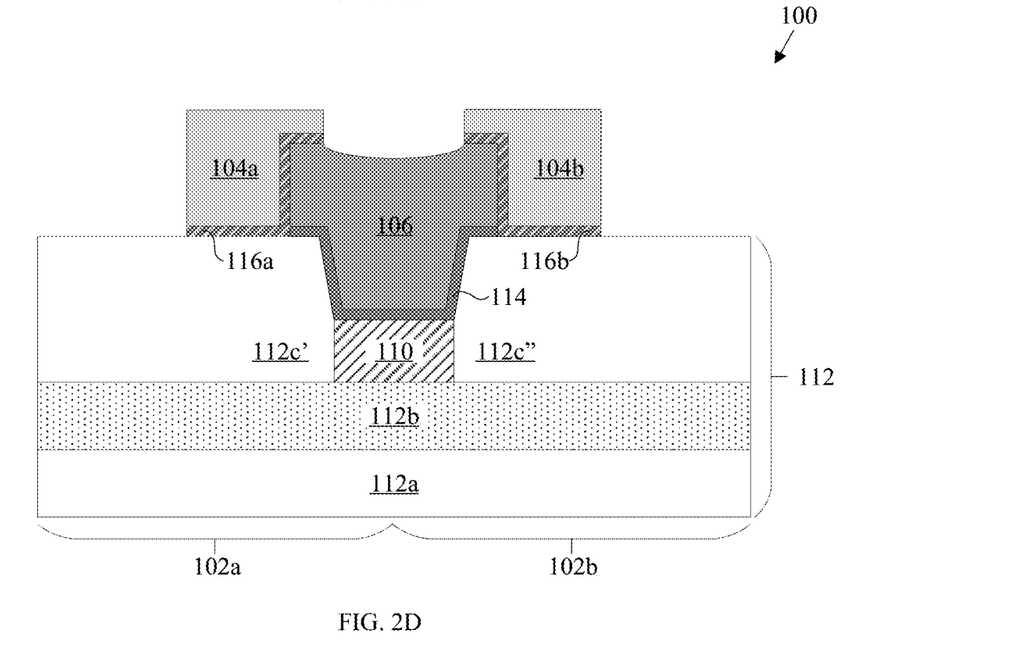

The first dielectric layer 116a and the first gate 104a may be formed in the first memory cell 102a and the second dielectric layer 116b and the second gate 104b may be formed in the second memory cell 102b as illustrated in FIG. 2D, according to an embodiment of the disclosure.

In an embodiment of the disclosure, the first and second dielectric layers (116a and 116b, respectively) and the first and second gates (104a and 104b, respectively) may be formed by an exemplary process described herein. A dielectric material (not shown) may be formed over the first and second portions of the second semiconductor layer (112c' and 112c", respectively) and over the third gate 106 using a deposition process, for example, a CVD process or an ALD process. A gate material (not shown) may be formed over the dielectric material (not shown) using another deposition process, for example, a CVD process or a plasma-enhanced CVD (PECVD) process. The first and second dielectric layers (116a and 116b, respectively) and the first and second gates (104a and 104b, respectively) may be formed by removing portions of the dielectric material (not shown) and portions of the gate material (not shown) using a material removal process, for example, a dry etching process. The first and second dielectric layers (116a and 116b, respectively) and the first and second gates (104a and 104b, respectively) may partially overlay laterally opposite sides of the third gate 106.

In an embodiment of the disclosure, spacer structures (not shown) may be arranged on sidewalls of the first and second gates (104a and 104b, respectively). The spacer structures (not shown) may serve to isolate the first and second gates (104a and 104b, respectively) from adjacent conductive features. The spacer structures (not shown) may include a dielectric material, such as but not limited to, silicon nitride.

The first doped region 108a may be formed adjacent to the first gate 104a in the first memory cell 102a, and the second doped region 108b may be formed adjacent to the second gate 104b in the second memory cell 102b, to form the NVM device 100 as illustrated in FIGS. 1A-1B.

In an embodiment of the disclosure, the first and second doped regions (108a and 108b, respectively) may be formed by an exemplary process described herein. The first and second doped regions (108a and 108b, respectively) may be formed by introducing dopants in the first and second portions of the second semiconductor layer (112c' and 112c", respectively). Regions of the NVM device 100 not intended to receive the dopants may be protected by forming a protective layer over those regions.

Figure 3A:
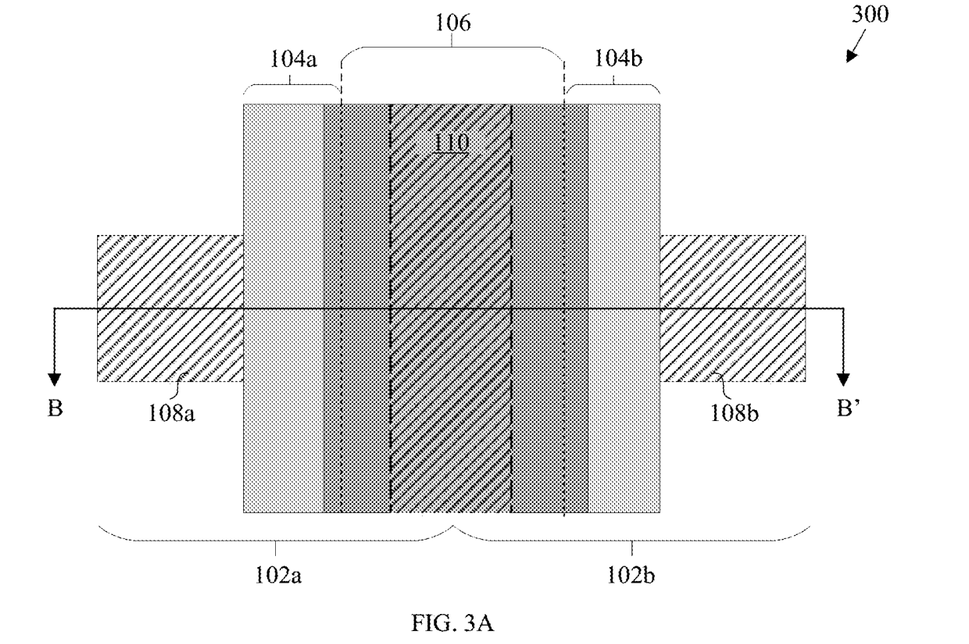
FIGS. 3A-3B are a simplified top view and a cross-sectional view of a non-volatile memory (NVM) device, respectively, according to an embodiment of the disclosure.
Figure 3B:
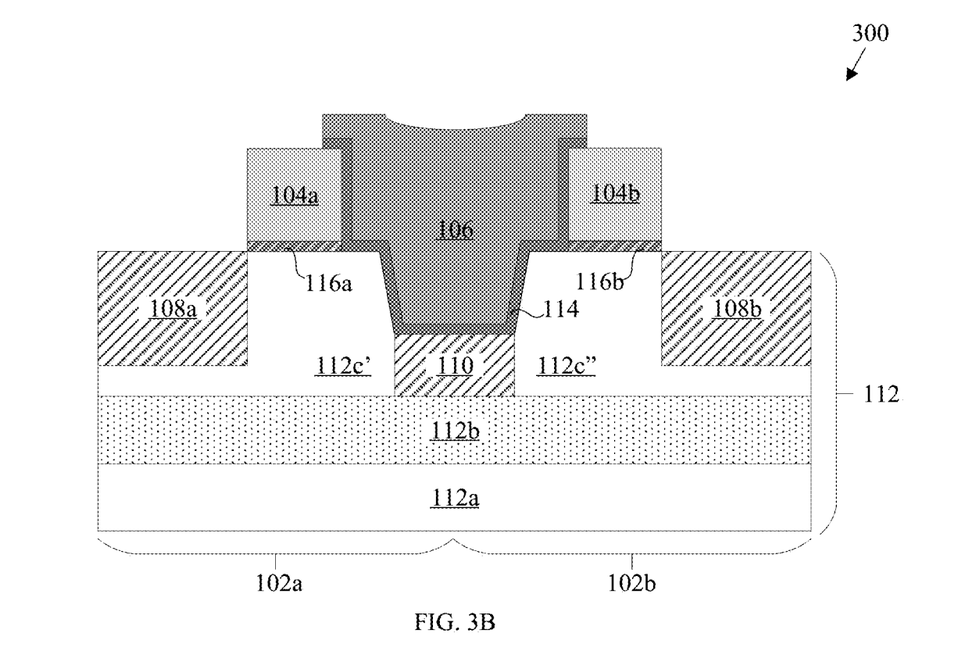

Referring to FIGS. 3A-3B, FIG. 3A is a simplified top view of a non-volatile memory (NVM) device 300 and FIG. 3B is a cross-sectional view of the NVM device 300 taken along a line B-B' in FIG. 3A, according to an embodiment of the disclosure. Similar to the embodiment of the NVM device 100 in FIGS. 1A-1B, the NVM device 300 may be arranged in a memory cell region of a semiconductor device and the NVM device 300 may be part of a plurality of NVM devices arranged in an array configuration of rows and columns in the memory cell region. Only one NVM device is illustrated for clarity purposes. The NVM device 300 may similarly include a first memory cell 102a and a second memory cell 102b.

The differences between the NVM device 300 in FIGS. 3A-3B and the NVM device 100 in FIGS. 1A-1B lie in the arrangement configuration of the third gate 106, the insulating layer 114, and the first and second dielectric layers (116a and 116b, respectively).

The third gate 106 partially overlays the first and second gates (104a and 104b, respectively), according to an embodiment of the disclosure. Sides of the first and second gates (104a and 104b, respectively) overlaid by the third gate 106 are demarcated by a pair of dotted lines, as illustrated in FIG. 3A.

The insulating layer 114 may extend between the first and third gates (104a and 106, respectively) and between the second and third gates (104b and 106, respectively), according to an embodiment of the disclosure. The insulating layer 114 serves to isolate the third gate 106 from the first and second gates (104a and 104b, respectively), in addition to isolating the third gate 106 from the third doped region 110 and the first and second portions of the second semiconductor layer (112c' and 112c", respectively).

The first dielectric layer 116b may serve to isolate the first gate 104a from the first portion of the semiconductor layer 112c' and the second dielectric layer 116b may serve to isolate the second gate 104b from the second portion of the semiconductor layer 112c", according to an embodiment of the disclosure.

Figure 4A:
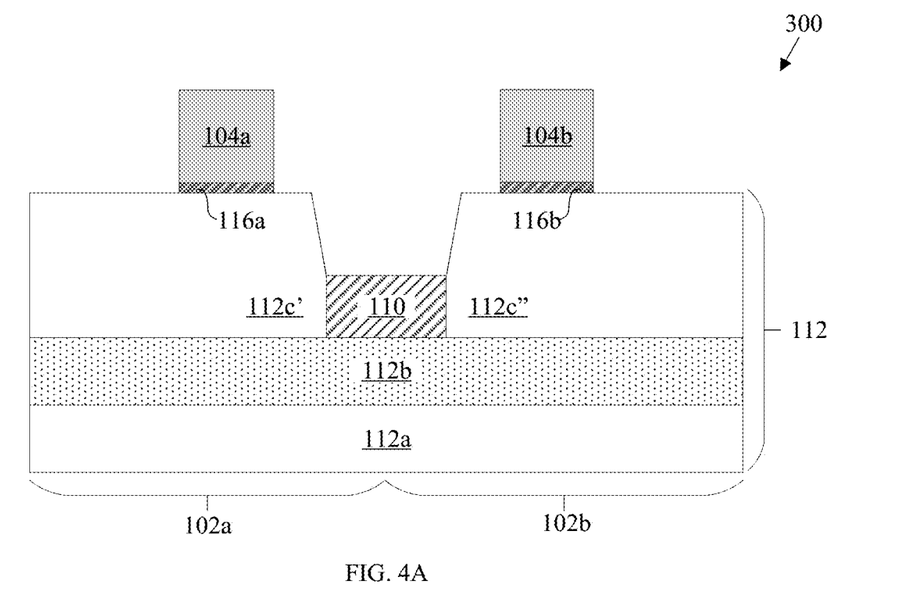
FIGS. 4A-4B are cross-sectional views of a non-volatile memory (NVM) device (taken along a line B-B' in FIG. 3A), illustrating various stages of forming the NVM device, according to embodiments of the disclosure.
Figure 4B:
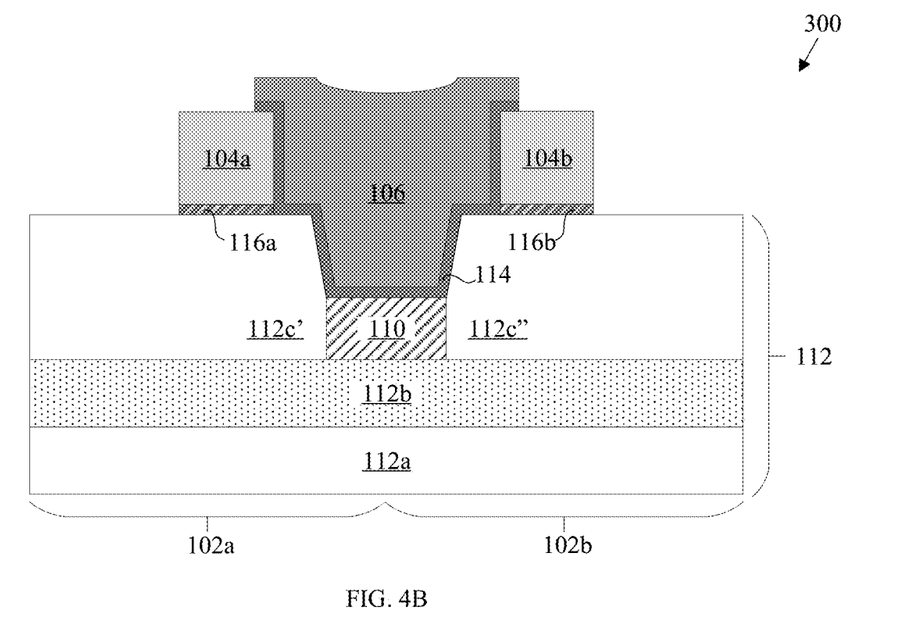

FIGS. 4A-4B are cross-sectional views of the NVM device 300 (taken along the line B-B' in FIG. 3A), illustrating a method of forming the NVM device 300, according to an embodiment of the disclosure. Certain structures may be conventionally fabricated, for example, using known processes and techniques, and specifically disclosed processes and methods may be used to achieve individual aspects of the present disclosure.

The NVM device 300 may be fabricated using similar fabrication steps as described with respect to FIGS. 2A-2B, and FIG. 4A continues from the embodiment illustrated in FIG. 2B.

Referring to FIG. 4A, the first and second dielectric layers (116a and 116b, respectively) and the first and second gates (104a and 104b, respectively) may be formed by an exemplary process described herein. A dielectric material (not shown) may be formed over the first and second portions of the second semiconductor layer (112c' and 112c", respectively) and the third doped region 110 using a deposition process, for example, a CVD process or an ALD process. A gate material (not shown) may be formed over the dielectric material (not shown) using another deposition process, for example, a CVD process or a plasma-enhanced CVD (PECVD) process. The first and second dielectric layers (116a and 116b, respectively) and the first and second gates (104a and 104b, respectively) may be formed by removing portions of the dielectric material (not shown) and portions of the gate material (not shown) using a material removal process, for example, a dry etching process.

Referring now to FIG. 4B, the insulating layer 114 and the third gate 106 may be formed over the third doped region 110 by an exemplary process described herein. An isolation material (not shown) may be deposited over first and second gates (104a and 104b, respectively) and over the third doped region 110 using a deposition process, for example, a CVD process or an atomic layer deposition (ALD) process. A gate material (not shown) may be deposited over the isolation material using a deposition process, for example, a CVD process or a physical vapor deposition (PVD) process. The insulating layer 114 and the third gate 106 may be formed by removing portions of the isolation material (not shown) and portions of the gate material (not shown) using a material removal process, for example, a dry etching process. The insulating layer 114 and the third gate 106 may extend over top surfaces of the first and second gates (104a and 104b, respectively). Further doping processes may be conducted to form the first doped region 108a adjacent to the first gate 104a in the first portion of the semiconductor layer 112c' and the second doped region 108b adjacent to the second gate 104b in the second portion of the semiconductor layer 112c", thereby forming the NVM device 300 shown in FIGS. 3A-3B. The first and second doped regions (108a and 108b, respectively) may or may not contact the buried dielectric layer 112b.

Figure 5A:
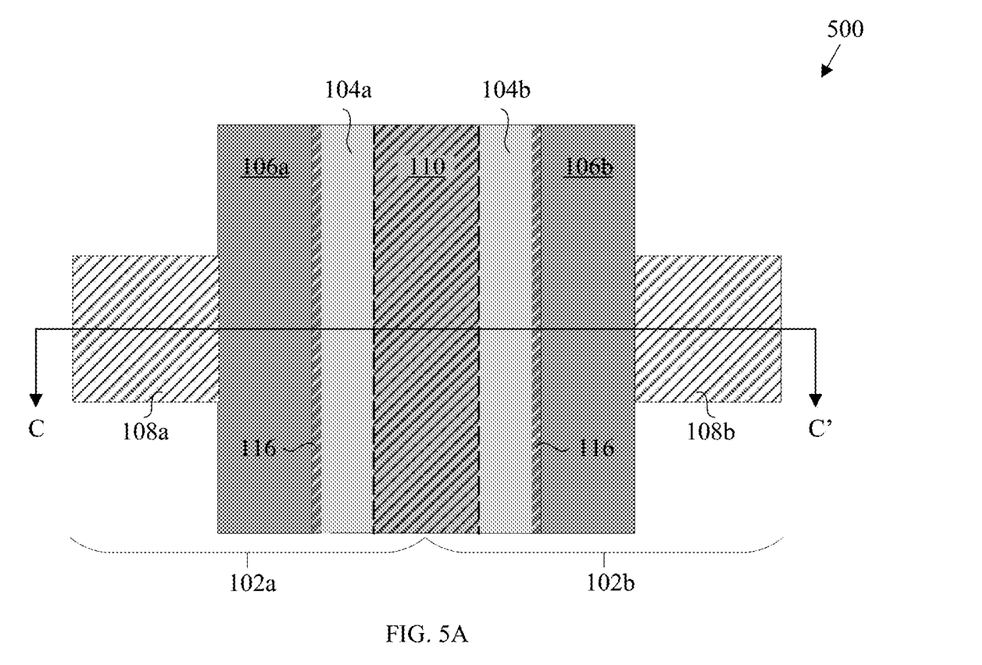
FIGS. 5A-5B are a simplified top view and a cross-sectional view of a non-volatile memory (NVM) device, respectively, according to an embodiment of the disclosure.
Figure 5B:
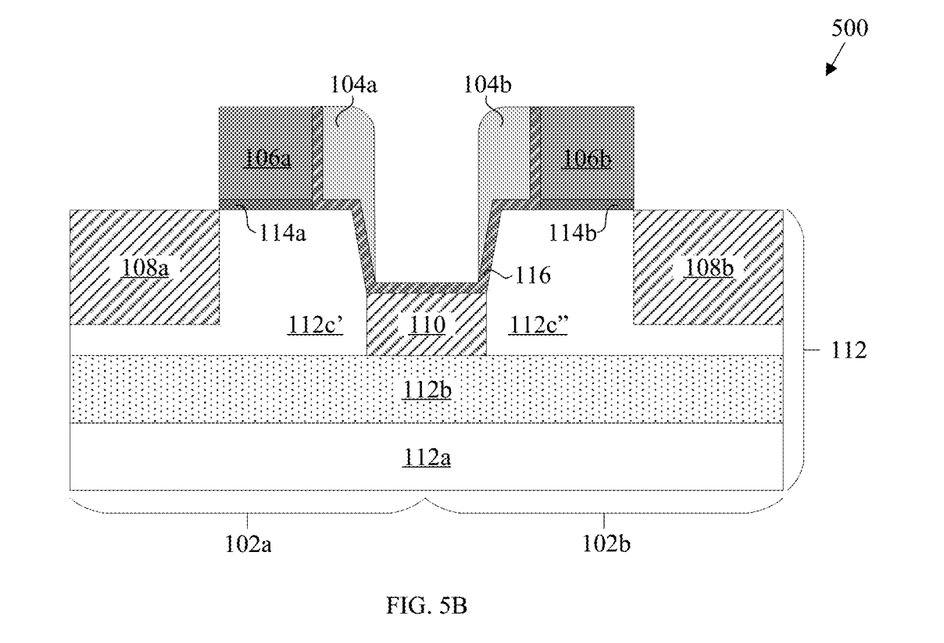

Referring to FIGS. 5A-5B, FIG. 5A is a simplified top view of a non-volatile memory (NVM) device 500 and FIG. 5B is a cross-sectional view of the NVM device 500 taken along a line C-C' in FIG. 5A, according to an embodiment of the disclosure. Similar to the embodiment of the NVM device 100 in FIGS. 1A-1B and the embodiment of the NVM device 300 in FIGS. 3A-3B, the NVM device 500 may be arranged in a memory cell region of a semiconductor device and the NVM device 500 may be part of a plurality of NVM devices arranged in an array configuration of rows and columns in the memory cell region. Only one NVM device is illustrated for clarity purposes. The NVM device 500 may similarly include a first memory cell 102a and a second memory cell 102b.

The NVM device 500 may include a first gate 104a, a second gate 104b, a third gate 106a, and a fourth gate 106b, a first doped region 108a, a second doped region 108b and a third doped region 110.

The first memory cell 102a may include the first gate 104a, the third gate 106a, the first doped region 108a and the third doped region 110. The first gate 104a may be arranged between the third gate 106a and the third doped region 110, and the third gate 106a may be arranged between the first doped region 108a and the first gate 104a. The first gate 104a may serve as a select gate while the third gate 106a may serve as a control gate for the first memory cell 102a.

The second memory cell 102b may include the second gate 104b, the fourth gate 106b, the second doped region 108b, and the third doped region 110. The second gate 104a may be arranged between the fourth gate 106b and the third doped region 110, and the fourth gate 106b may be arranged between the second doped region 108b and the second gate 104b. The second gate 104b may serve as a select gate while the fourth gate 106b may serve as a control gate for the second memory cell 102b.

In an embodiment of the disclosure, the first, second, third and fourth gates (104a, 104b, 106a, and 106b, respectively) may be arranged in an arrangement configuration such that the gates have substantially coplanar top surfaces, i.e., the first gate 104a and the third gate 106a do not overlap each other and the second gate 104b and the fourth gate 106b also do not overlap each other, as illustrated in FIG. 5B.

The third doped region 110 may be arranged between the first and second gates (104a and 104b, respectively) such that the third doped region 110 may be shared between the first memory cell 102a and the second memory cell 102b. In an embodiment of the disclosure, the third doped region 110 may be a line feature that extends beyond the NVM device 500, as illustrated in FIG. 5A, and serves as a common doped region for a row of NVM devices in the array. In an embodiment of the disclosure, the first and second doped regions (108a and 108b, respectively) may be discrete doped regions.

In an embodiment of the disclosure, the first doped region 108a may serve as a first drain region in the first memory cell 102a and the second doped region 108b may serve as a second drain region in the second memory cell 102b. The third doped region 110 may serve as a source line for the NVM device 500.

The dielectric layer 116 may be arranged between the first gate 104a and the third gate 106a, between the second gate 104b and the fourth gate 106b, between the third gate 106a and the first portion of the second semiconductor layer 112c', and between the fourth gate 106b and the second portion of the second semiconductor layer 112c". The dielectric layer 116 may also be arranged over the third doped region 110.

In an embodiment of the disclosure, the dielectric layer 116 may serve to isolate the third gate 106a from the first gate 104a and the first portion of the second semiconductor layer 112c' and additionally, the dielectric layer 116 may serve to isolate the fourth gate 106b from the second gate 104b and the second portion of the second semiconductor layer 112c".

In an embodiment of the disclosure, the first insulating layer 114a may be arranged in the first memory cell 102a, interposed between the first gate 104a and the first portion of the second semiconductor layer 112c'. The second insulating layer 114b may be arranged in the second memory cell 102b, interposed between the second gate 104b and the second portion of the second semiconductor layer 112c".

In an embodiment of the disclosure, the first and second insulating layers (114a and 114b, respectively) may include a charge-trapping material that may be capable of or facilitate trapping of charges. In an embodiment of the disclosure, the first and second insulating layers (114a and 114b, respectively) may include a dielectric material having a dielectric constant greater than 3.9.

Figure 6A:
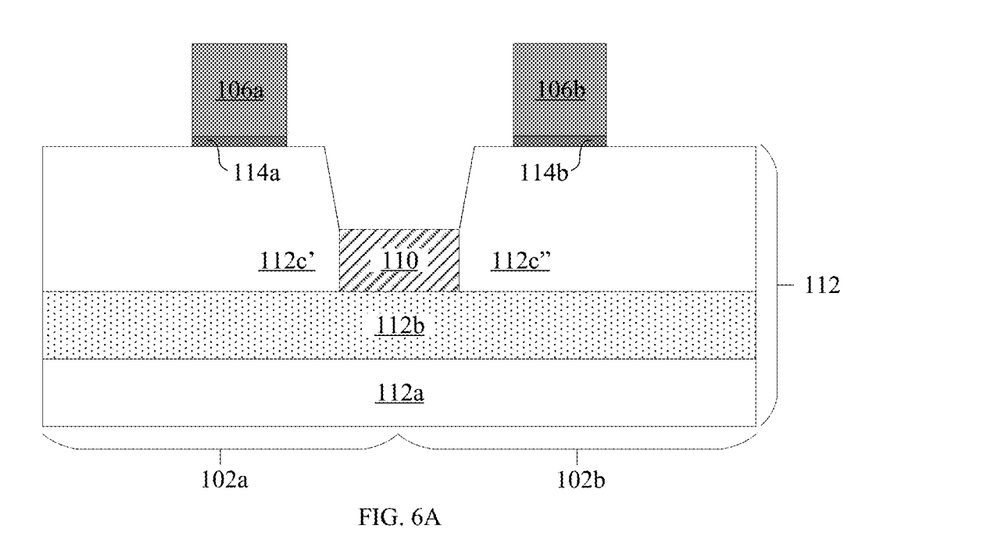
FIGS. 6A-6B are cross-sectional views of a non-volatile memory (NVM) device (taken along a line C-C' in FIG. 5A), illustrating various stages of forming the NVM device, according to embodiments of the disclosure.
Figure 6B:
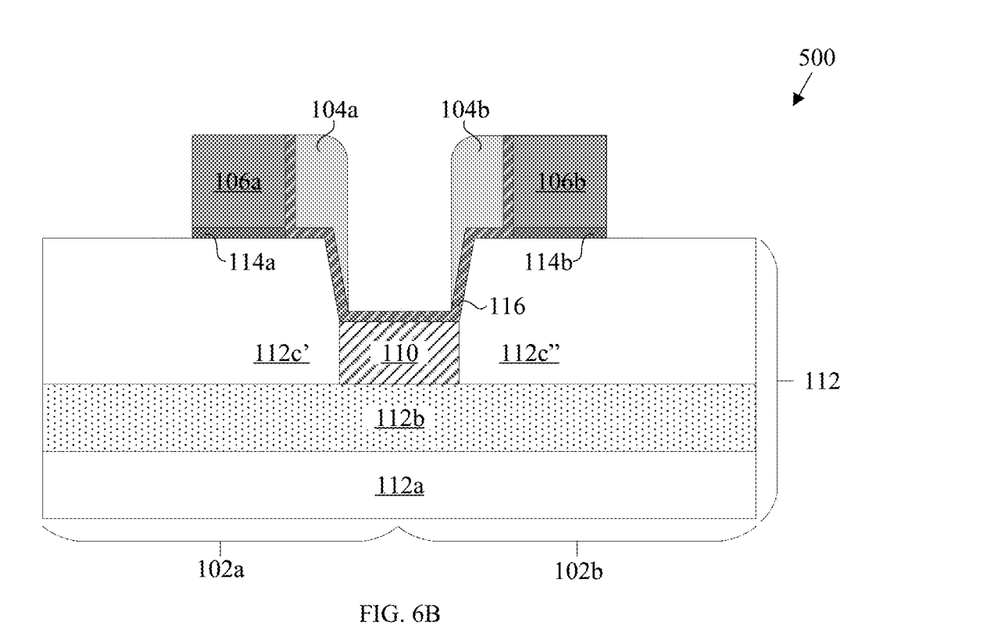

FIGS. 6A-6B are cross-sectional views of the NVM device 500 (taken along the line C-C' in FIG. 5A), illustrating a method of forming the NVM device 500, according to an embodiment of the disclosure. Certain structures may be conventionally fabricated, for example, using known processes and techniques, and specifically disclosed processes and methods may be used to achieve individual aspects of the present disclosure.

The NVM device 500 may be fabricated using similar fabrication steps as described with respect to FIGS. 2A-2B, and FIG. 6A continues from the embodiment illustrated in FIG. 2B. As illustrated in FIG. 6A, the first insulating layer 114a and the third gate 106a may be formed in the first memory cell 102a and the second insulating layer 114b and the fourth gate 106b may be formed in the second memory cell 102b as illustrated in FIG. 6A, according to an embodiment of the disclosure.

In an embodiment of the disclosure, the first and second insulating layers (114a and 114b, respectively) and the third and fourth gates (106a and 106b, respectively) may be formed by an exemplary process described herein. An insulating material (not shown) may be formed over the first and second portions of the second semiconductor layer (112c' and 112c", respectively) and the third doped region 110 using a deposition process, for example, a CVD process or an ALD process. A gate material (not shown) may be formed over the insulating material (not shown) using another deposition process, for example, a CVD process or a plasma-enhanced CVD (PECVD) process. The first and second insulating layers (114a and 114b, respectively) and the third and fourth gates (106a and 106b, respectively) may be formed by removing portions of the insulating material (not shown) and portions of the gate material (not shown) using a material removal process, for example, a dry etching process.

The dielectric layer 116 and the first and second gates (104a and 104b, respectively) may be formed adjacent to the third and fourth gates (106a and 106b, respectively) as illustrated in FIG. 6B, according to an embodiment of the disclosure.

The dielectric layer 116 and the first and second gates (104a and 104b, respectively) may be formed by an exemplary process described herein. A dielectric material (not shown) may be deposited over third and fourth gates (106a and 106b, respectively) and over the third doped region 110 using a deposition process, for example, a CVD process or an atomic layer deposition (ALD) process. A gate material (not shown) may be deposited over the dielectric material using a deposition process, for example, a CVD process or a physical vapor deposition (PVD) process. The dielectric layer 116 and the first and second gates (104a and 104b, respectively) may be formed by removing portions of the dielectric material (not shown) and portions of the gate material (not shown) using a material removal process, for example, a dry etching process. The dielectric layer 116 and the first and second gates (104a and 104b, respectively) may have substantially coplanar top surfaces with the first and second control gates (106a and 106b, respectively).

The first doped region 108a may be formed adjacent to the third gate 106a in the first portion of the semiconductor layer 112c' and the second doped region 108b may be formed adjacent to the fourth gate 106b in the second portion of the semiconductor layer 112c", to form the NVM device 500 as illustrated in FIGS. 5A-5B. The first and second doped regions (108a and 108b, respectively) may or may not contact the buried dielectric layer 112b.

As presented above, various embodiments of an NVM device having a pair of memory cells have been described. The NVM device may be arranged in a memory cell region of a semiconductor device and the NVM device may be part of a plurality of NVM devices arranged in an array configuration of rows and columns in the memory cell region. In an embodiment of the disclosure, a row of the array corresponds to a word line or a select gate line, and a column of the array corresponds to a bit line that is perpendicular to the word line.

The pair of memory cells may include a plurality of gates and a plurality of doped regions. The plurality of gates may include at least one control gate and a pair of select gates, and the plurality of doped regions may include a source region and a pair of drain regions. The source region may be a shared source region between the pair of memory cells of the NVM device, enabling the NVM device to achieve a higher device density. The source region may further be a common source region for a row of NVM devices in the array. The control gate with adjacent source and drain regions may form a memory transistor device and the select gate with adjacent source and drain regions may form a select transistor device for a memory cell.

In an embodiment, the NVM device may include a pair of silicon-oxide-nitride-oxide-silicon (SONOS) memory cells. The control gate of the memory cell has an insulating layer that may be capable of or facilitate trapping of charges. The term "SONOS" memory cell as used herein may contain an insulating layer having any insulating material, and not limited to an ONO trilayer dielectric stack, as long as the insulating layer is capable of or facilitate trapping of charges. The SONOS memory cell may contain an ONO trilayer dielectric stack only when a specific reference to such a dielectric stack is indicated.

A plurality of contacts and conductive lines may be provided to couple the plurality of gates and the plurality of doped regions. For example, a row control gates in the array may be coupled to a word line and a row of select gates may be coupled to select gates of the memory cells. In another example, a column of drain regions may be coupled to a bit line. In an embodiment, the word lines may provide voltages to the row of control gates and the bit lines may provide voltages to the column of drain regions.

A memory cell may be accessed by applying appropriate voltages to the word line, the select gate line, and the bit line. A memory cell or a plurality of memory cells may be selected for access. Memory access may include a program having a write or erase operation. Table 1 below shows a set of exemplary signals that may be applied to a memory cell, e.g., the memory cell 102a of FIG. 1A, for the different memory access operations. It is understood that other suitable types of voltage values may be applied, depending on the design and technology node of the memory cell.

|  | Bit Line | Select Gate | Control Gate | Source Line |
| --- | --- | --- | --- | --- |
| Program (SSI) | 1 μA~10 μA | 1.5 V~2.5 V | <9 V | 4 V~5 V |
| Erase (F-N Tunneling) | 0 V | 0 V | 12 V~15 V | 0 V |
| Read | 0.5 V~1 V | 1.5 V~2.5 V | 1.5 V~2.5 V | 0 V |

In an embodiment of the disclosure, the memory cell may be programmed by a source-side injection (SSI) technique for fast programming speed and may be erased by Fowler-Nordheim (F-N) tunneling mechanism for uniform erasing. Programming and erasing NVM memory cells have known techniques in the art.

The terms "top", "bottom", "over", "under", and the like in the description and in the claims, if any, are used for descriptive purposes and not necessarily for describing permanent relative positions. It is to be understood that the terms so used are interchangeable under appropriate circumstances such that the embodiments of the devices described herein are, for example, capable of operation in other orientations than those illustrated or otherwise described herein.

Additionally, the formation of a first feature over or on a second feature in the description that follows may include embodiments in which the first and second features are formed in direct contact, and may also include embodiments in which additional features may be formed interposing the first and second features, such that the first and second features may not be in direct contact.

Similarly, if a method is described herein as involving a series of steps, the order of such steps as presented herein is not necessarily the only order in which such steps may be performed, and certain of the stated steps may possibly be omitted and/or certain other steps not described herein may possibly be added to the method. Furthermore, the terms "comprise", "include", "have", and any variations thereof, are intended to cover a non-exclusive inclusion, such that a process, method, article, or device that comprises a list of elements is not necessarily limited to those elements, but may include other elements not expressly listed or inherent to such process, method, article, or device. Occurrences of the phrase "in an embodiment" herein do not necessarily all refer to the same embodiment.

In addition, unless otherwise indicated, all numbers expressing quantities, ratios, and numerical properties of materials, reaction conditions, and so forth used in the specification and claims are to be understood as being modified in all instances by the term "about".

While several exemplary embodiments have been presented in the above detailed description of the device, it should be appreciated that a number of variations exist. It should further be appreciated that the embodiments are only examples, and are not intended to limit the scope, applicability, dimensions, or configuration of the device in any way. Rather, the above detailed description will provide those skilled in the art with a convenient road map for implementing an exemplary embodiment of the device, it being understood that various changes may be made in the function and arrangement of elements and method of fabrication described in an exemplary embodiment without departing from the scope of this disclosure as set forth in the appended claims.

What is claimed is:

1. A memory device comprising:
a substrate having a buried dielectric layer;
a first memory cell arranged over the substrate; and
a second memory cell arranged adjacent to the first memory cell, wherein the first memory cell and the second memory cell include a shared doped region in the substrate that is arranged between the first memory cell and the second memory cell, and the shared doped region contacts the buried dielectric layer of the substrate.

2. The memory device of claim 1, further comprising:
a control gate partially within the substrate and arranged over the shared doped region, wherein the control gate is shared by the first memory cell and the second memory cell.

3. The memory device of claim 2, further comprising:
a charge-trapping layer arranged between the control gate and the shared doped region.

4. The memory device of claim 2, further comprising:
a first gate arranged laterally to a first side of the control gate, wherein the first gate operates as a select gate for the first memory cell; and
a second gate arranged laterally to a second side of the control gate, wherein the second gate operates as a select gate for the second memory cell.

5. The memory device of claim 4, wherein the first gate and the second gate partially overlay the control gate.

6. The memory device of claim 4, wherein the control gate partially overlays the first gate and the second gate.

7. The memory device of claim 1, further comprising:
a first doped region within the first memory cell; and
a second doped region within the second memory cell.

8. The memory device of claim 7, wherein the shared doped region is a source region for the first memory cell and the second memory cell, the first doped region is a drain region for the first memory cell, and the second doped region is a drain region for the second memory cell.

9. A memory device comprising:
a substrate having a buried dielectric layer;
a first memory cell arranged over the substrate, wherein the first memory cell comprises a first select gate; and
a second memory cell arranged adjacent to the first memory cell, wherein the second memory cell comprises a second select gate, and the first memory cell and second memory cell share a source region and a control gate.

10. The memory device of claim 9, further comprising:
a first doped region within the first memory cell; and
a second doped region within the second memory cell.

11. The memory device of claim 9, wherein the source region is arranged below the control gate and contacts the buried dielectric layer.

12. The memory device of claim 9, further comprising a charge-trapping layer arranged between the control gate and the substrate, wherein the charge-trapping layer completely underlies a lower surface of the control gate.

13. A memory device comprising:
a substrate having a buried dielectric layer;
a first memory cell comprising a first control gate, a first select gate, and a shared source region; and
a second memory cell comprising a second control gate, a second select gate, and the shared source region, wherein the shared source region is arranged between the first and second memory cells, and wherein the first select gate and the second select gate are arranged between the first control gate and the second control gate.

14. The memory device of claim 13, further comprises a charge-trapping layer separating the first control gate and the second control gate from the substrate, wherein the charge-trapping layer completely underlies a lower surface of the first control gate and a lower surface of the second control gate.

15. The memory device of claim 13, further comprises a dielectric layer arranged between the first control gate and the first select gate, and between the second control gate and the second select gate.

16. The memory device of claim 13, further comprises a first drain region arranged within the first memory cell and a second drain region arranged within the second memory cell.

* * * * *